(12) United States Patent
Hadjizada et al.

(10) Patent No.: US 6,690,210 B2
(45) Date of Patent: Feb. 10, 2004

(54) TRANSMITTING DEVICE

(75) Inventors: Abdul-Karim Hadjizada, Ratingen (DE); Christian Kranz, Ratingen-Lintorf (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/157,641

(22) Filed: May 29, 2002

(65) Prior Publication Data

US 2002/0145482 A1 Oct. 10, 2002

Related U.S. Application Data

(63) Continuation of application No. PCT/DE00/04239, filed on Nov. 27, 2000.

(30) Foreign Application Priority Data

Dec. 2, 1999 (DE) .......................... 199 58 206

(51) Int. Cl.⁷ .............................................. H03L 7/185
(52) U.S. Cl. .............................. 327/105; 327/15; 327/6; 331/1 A
(58) Field of Search ................................ 327/156, 157, 327/105; 331/1 A, 2, 14

(56) References Cited

U.S. PATENT DOCUMENTS

| | | | | |
|---|---|---|---|---|
| 5,027,087 A | | 6/1991 | Rottinghaus | 331/14 |
| 5,483,203 A | | 1/1996 | Rottinghaus | 331/1 A |
| 5,831,481 A | * | 11/1998 | Oga | 331/1 A |
| 6,157,260 A | * | 12/2000 | Tilley et al. | 331/2 |

FOREIGN PATENT DOCUMENTS

| | | |
|---|---|---|
| DE | 29 35 582 | 3/1980 |
| DE | 29 27 854 | 1/1981 |
| DE | 39 35 829 A1 | 5/1991 |
| EP | 0 961 412 A1 | 12/1999 |
| WO | WO 86/00767 | 1/1986 |

* cited by examiner

*Primary Examiner*—Dinh T. Le
(74) *Attorney, Agent, or Firm*—Laurence A. Greenberg; Werner H. Stemer; Gregory L. Mayback

(57) ABSTRACT

A transmitting device generates a modulation signal depending on data to be transmitted. The transmitting device includes a transmission frequency generation device that is controlled depending on the signal in order to produce a transmission frequency corresponding to the modulation signal. A calibration device is provided for automatically calibrating the amplitude of the modulation signal during the operation of the transmitting device. This eliminates time-consuming and therefore costly adjustment steps during the production of the transmitting device.

10 Claims, 2 Drawing Sheets

TRANSMITTING DEVICE

CROSS-REFERENCE TO RELATED APPLICATION

This application is a continuation of copending International Application No. PCT/DE00/04239, filed Nov. 27, 2000, which designated the United States and was not published in English.

BACKGROUND OF THE INVENTION

FIELD OF THE INVENTION

The present invention relates to a transmitting device in which transmission data are modulated onto a carrier signal.

In transmitting devices ("transmitters"), in which transmission data are modulated onto a carrier frequency, the modulation peak or peak-to-peak amplitude (defined herein as a modulation amplitude) that can be implemented in the modulation is limited, since the transmission bandwidth is dependent thereon. It must therefore be ensured that the modulation peak-to-peak amplitude always remains within specific limits.

Known transmitting devices include a device for generating a modulation signal depending on the transmission data, and also a device controlled by the modulation signal, which generates an RF frequency corresponding to the modulation signal. The last-mentioned device may, in particular, involve a voltage-controlled oscillator (VCO), to which a control signal that is adjusted via a phase-locked loop (PLL) is fed. The modulation signal is modulated using the voltage-controlled oscillator. The frequency-defining components used in the voltage-controlled oscillator (normally capacitance diodes) are subject to specific manufacturing tolerances, as a result of which the characteristic curve, or transconductance of the voltage-controlled oscillator may fluctuate by ±100%.

In known transmitting devices, a one-off adjustment step specifically provided for calibrating the modulation peak-to-peak amplitude is therefore carried out during the manufacturing of the corresponding transmitting device or equipment (e.g. a mobile telephone) in which the transmission device is used. During this adjustment step, the current modulation peak-to-peak amplitude of the transmitting device is first measured and the modulation peak-to-peak amplitude is then adjusted to the required value, whereby the modulation signal is set accordingly for this purpose, for example by laser trimming, by using adjustable resistors, or digitally by using software.

This adjustment step that is to be additionally carried out during manufacture is relatively time-consuming and costly.

SUMMARY OF THE INVENTION

It is accordingly an object of the invention to provide a transmitting device which overcomes the above-mentioned disadvantages of the prior art apparatus of this general type.

In particular, it is an object of the invention to provide a transmitting device that makes it possible to dispense with the time-consuming adjustment step during the manufacturing of the transmitting device.

With the foregoing and other objects in view there is provided, in accordance with the invention, a transmitting device, including: a modulation signal generation device for generating a modulation signal depending on data to be transmitted; a transmission frequency generation device generating a transmission frequency corresponding to the modulation signal, and a calibration device for automatically calibrating the modulation signal. The transmission frequency generation device is controlled depending on the modulation signal. The calibration device includes a measuring device for measuring a control signal that is being fed to the transmission frequency generation device. The calibration device includes a modulation amplitude determining device. The modulation amplitude determining device is designed for digitally determining a modulation amplitude value. The modulation signal generation device includes a transmission data generation device and either a digital multiplier, an equalizer, or a similar device. The component is connected to the transmission data generation device and to the modulation amplitude determining device.

In accordance with an added feature of the invention, the transmission frequency generation device exhibits a characteristic curve. The modulation amplitude determining device determines the modulation amplitude value for the modulation signal by approximating the characteristic curve of the transmission frequency generation device.

In accordance with an added feature of the invention, a modulation device modulates the modulation signal onto the control signal.

In accordance with an additional feature of the invention, the measuring device for measuring the control signal includes a sample and hold amplifier.

In accordance with a further feature of the invention, the measuring device for measuring the control signal includes an analog amplifier.

In accordance with a further added feature of the invention, a phase-locked loop is provided for generating and adjusting the control signal. The phase-locked loop obtains the transmission frequency from the transmission frequency generation device. The phase-locked loop also obtains a reference frequency. The phase-locked loop generates the control signal depending on a ratio of the transmission frequency to the reference frequency.

In accordance with another added feature of the invention, the phase-locked loop is a Fractional N Sigma Delta phase-locked loop.

In accordance with another additional feature of the invention, there is provided, a modulation device that modulates the modulation signal onto the control signal. The measuring device taps and measures the control signal upstream of the modulation device.

The inventive transmitting device includes a calibration device that enables automatic calibration of the modulation signal continuously during the operation of the transmitting device. The calibration device may, in particular, be designed in such a way that the amplitude of the modulation signal is continuously adapted by the calibration device.

In order to generate the transmission frequency, a voltage-controlled oscillator with a phase-locked loop is preferably used. The calibration device measures, in particular, the control voltage fed to the voltage-controlled oscillator by the phase-locked loop, and sets the modulation peak or peak-to-peak amplitude of the modulation signal depending thereon. The control voltage is preferably measured before the modulation signal is modulated onto the control signal. The modulation peak-to-peak amplitude may be defined, for example, by digitally approximating the curve of the voltage-controlled oscillator.

The present invention allows the adjustment step that hitherto had to be performed during manufacturing to be dispensed with, since, according to the invention, the automatic calibration of the modulation signal, and therefore the modulation peak-to-peak amplitude is continuously carried out during operation. This results in reduced manufacturing time and therefore, also in reduced manufacturing costs.

The present invention can be applied to transmitting devices with analog or digital modulation. In particular, the present invention is suitable for use in mobile radio systems, for example in DECT (Digital Enhanced Cordless Telecommunications) or Bluetooth mobile radio transmitters.

Other features which are considered as characteristic for the invention are set forth in the appended claims.

Although the invention is illustrated and described herein as embodied in a transmitting device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
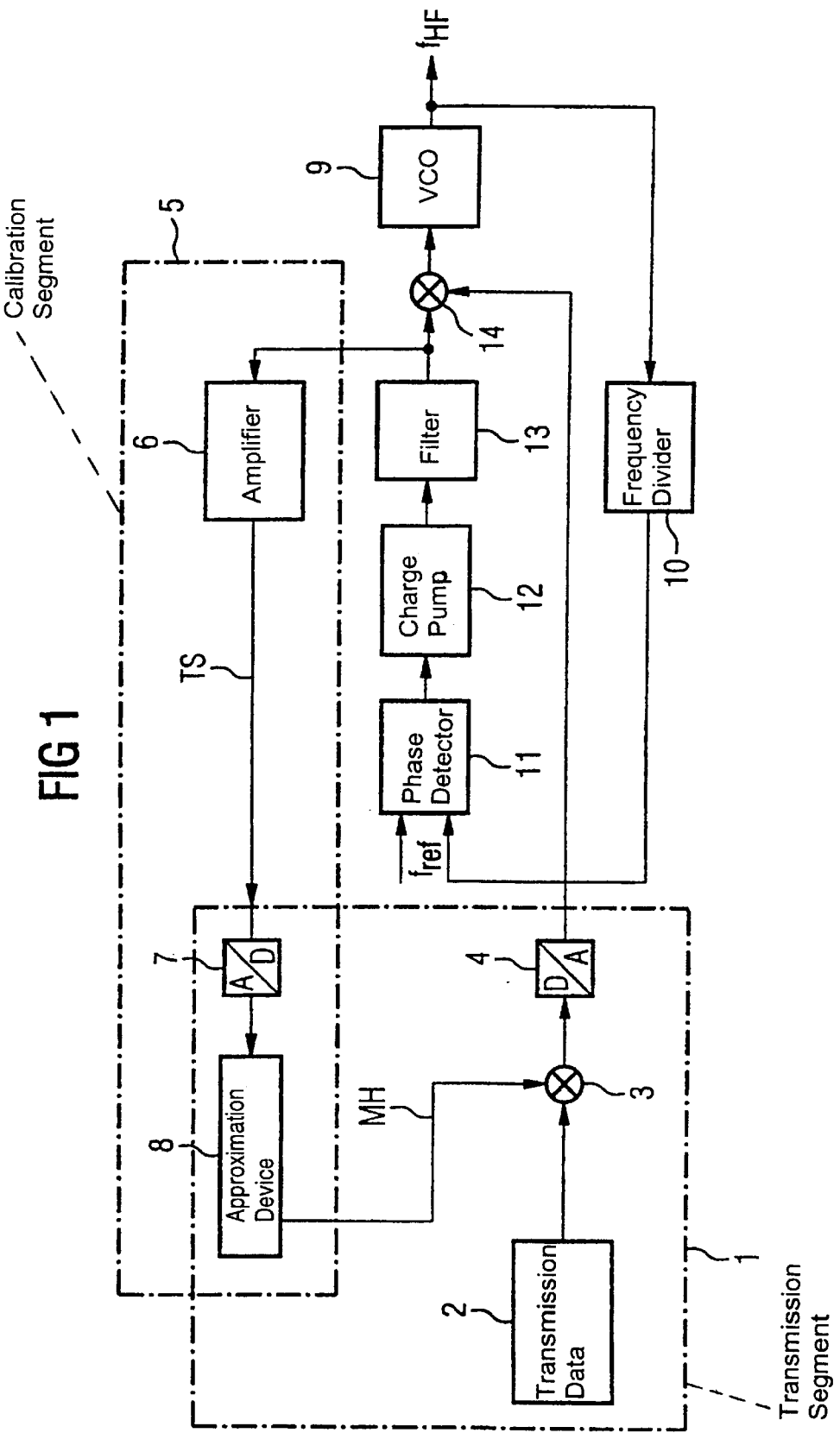
FIG. 1 is a simplified block diagram of an inventive transmitting device.

Referring now to the figures of the drawing in detail and first, particularly, to FIG. 1 thereof, there is shown a transmitting device that essentially includes a digital transmission segment 1 for generating a modulation signal depending on data to be transmitted, a segment for generating a radio-frequency transmission frequency $f_{HF}$ depending on the modulation signal, and a calibration segment 5 for automatically calibrating the modulation signal.

The digital transmission segment 1 includes a device 2 for generating the modulation signal depending on the transmission data, whereby the modulation signal is fed via a digital multiplier 3 and a digital/analog converter (D/A converter) 4 to a further multiplier or modulator 14.

The radio-frequency transmission frequency $f_{HF}$ is generated by a voltage-controlled oscillator (VCO) 9 that is controlled by a phase-locked loop (PLL) 10–13. The phase-locked loop includes a frequency divider 10 that divides the transmission frequency $f_{HF}$ generated by the voltage-controlled oscillator 9 according to a predefined division ratio and feeds it to a phase detector 11. The phase detector 11 furthermore receives a reference frequency $f_{ref}$, with which the frequency divided by the frequency divider 10 is compared. Depending on the result of the comparison, a control signal is generated for a charge pump 12, which in turn outputs a corresponding tuning voltage for the voltage-controlled oscillator 9. The tuning voltage passes through a low-pass filter 13 before being fed to the voltage-controlled oscillator 9. In this way, the transmission frequency 9 output by the voltage-controlled oscillator 9 is adjusted to the reference frequency $f_{ref}$, taking into account the division ratio of the frequency divider 10. The design of the phase-locked loop is irrelevant to the present invention. For example, either a 'conventional' phase-locked loop or a phase-locked loop designed in the form of a "Fractional N Sigma Delta" PLL may be used.

The modulation signal is modulated onto the tuning voltage using the aforementioned modulator 14 and is then fed to the voltage-controlled oscillator 9.

The calibration segment 5 includes a device 6 for measuring the tuning voltage of the voltage-controlled oscillator 9. This device 6 may be formed, for example, by a sample-hold amplifier or an analog amplifier. The tuning voltage of the voltage-controlled oscillator 9 is preferably measured before the modulation signal is modulated onto the tuning voltage.

If a transmitting device is used which, in contrast to the embodiment shown in FIG. 1, operates in an 'open loop' rather than in a 'closed loop', it is appropriate to measure the tuning voltage of the voltage-controlled oscillator before changing over to the 'open loop'.

The analog tuning voltage TS measured in this way is fed via an A/D converter 7 to an approximation device 8. The approximation device 8 performs a digital approximation of the characteristic curve of the voltage-controlled oscillator 9, in order then to determine the necessary modulation peak-to-peak amplitude MH with reference to the approximated curve. The amplitude of the modulation signal generated by the device 2 is multiplied in the multiplier 3 by the determined value of the modulation peak-to-peak amplitude MH, so that the amplitude of the modulation signal is automatically and continuously calibrated during operation.

An equalizer or the like can also be used instead of the multiplier 3 to set the amplitude of the modulation signal depending on the modulation peak-to-peak amplitude MH. In addition, the present invention can also be applied, for example, to phase-locked loops with several, especially two, capacitance diodes that can be matched via a digital algorithm. Capacitance diodes are preferably used, in particular, for wider frequency bands.

Figure 2:
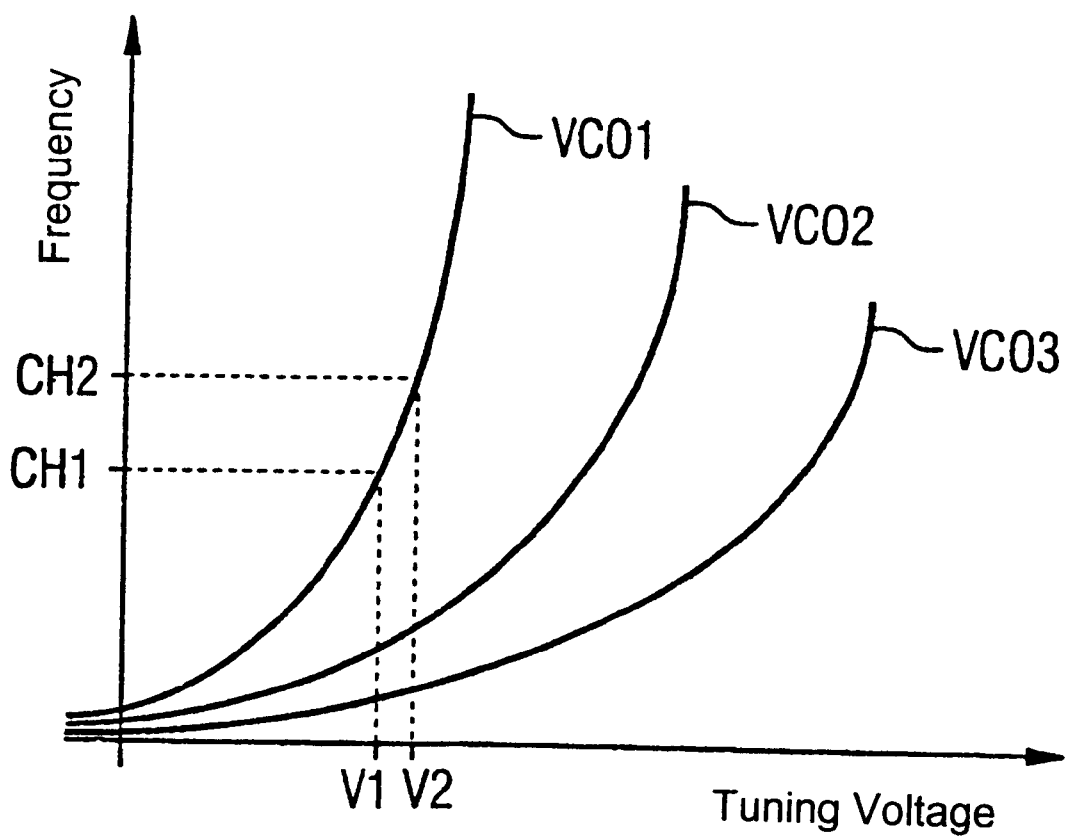
FIG. 2 shows different curves of a voltage-controlled oscillator.

FIG. 2 shows various curves VCO1 ... VCO3 of the voltage-controlled oscillator 9, whereby each curve indicates the transmission frequency $f_{HF}$ generated by the voltage-controlled oscillator 9 depending on the tuning voltage. The modulation peak-to-peak amplitude MH required to generate a specific transmission frequency can simply be determined through an approximation of the relevant curve following the measurement of the tuning voltage. Various measurement points of the relevant curve, if available, may also be included in the curve approximation, which may be the case, for example, if transmission devices with a plurality of transmission channels are involved. In this context, two possible transmission channels CH1 and CH2 with the relevant corresponding tuning voltage values V1 and V2 are shown on the curve VCO1 in FIG. 2.

We claim:

1. A transmitting device, comprising:
   a modulation signal generation device for generating a modulation signal depending on data to be transmitted;
   a transmission frequency generation device generating a transmission frequency corresponding to said modulation signal, said transmission frequency generation device being controlled depending on said modulation signal; and
   a calibration device for automatically calibrating said modulation signal;
   said calibration device including a measuring device for measuring a control signal being fed to said transmission frequency generation device;

said calibration device including a modulation amplitude determining device;

said modulation amplitude determining device being designed for digitally determining a modulation amplitude value;

said modulation signal generation device including a transmission data generation device and a component selected from the group consisting of a digital multiplier and an equalizer; and said component being connected to said transmission data generation device and to said modulation amplitude determining device.

2. The transmitting device according to claim 1, wherein:

said transmission frequency generation device exhibits a characteristic curve; and said modulation amplitude determining device determines said modulation amplitude value for said modulation signal by approximating said characteristic curve of said transmission frequency generation device.

3. The transmitting device according to claim 1, comprising: a modulation device modulating said modulation signal onto said control signal.

4. The transmitting device according to claim 1, wherein: said measuring device for measuring said control signal includes a sample and hold amplifier.

5. The transmitting device according to claim 1, wherein: said measuring device for measuring said control signal includes an analog amplifier.

6. The transmitting device according to claim 1, comprising:

a phase-locked loop for generating and adjusting said control signal;

said phase-locked loop obtaining said transmission frequency from said transmission frequency generation device;

said phase-locked loop obtaining a reference frequency; and said phase-locked loop generating said control signal depending on a ratio of said transmission frequency to said reference frequency.

7. The transmitting device according to claim 6, wherein: said phase-locked loop is a Fractional N Sigma Delta phase-locked loop.

8. The transmitting device according to claim 6, comprising:

a modulation device modulating said modulation signal onto said control signal;

said measuring device taping and measuring said control signal upstream of said modulation device.

9. The transmitting device according to claim 1, comprising:

a modulation device modulating said modulation signal onto said control signal;

said measuring device taping and measuring said control signal upstream of said modulation device.

10. The transmitting device according to claim 1, wherein: said modulation signal generation device, said transmission frequency generation device, and said calibration device are configured in a mobile radio transmitter selected from the group consisting of a DECT mobile radio transmitter and a Bluetooth mobile radio transmitter.

* * * * *